US012635454B2

(12) United States Patent
Chen et al.

(10) Patent No.: US 12,635,454 B2
(45) Date of Patent: May 19, 2026

(54) SYSTEMS AND METHODS FOR DETERMINING RESIDUAL COMPOUNDS IN PLASMA PROCESS

(71) Applicant: Taiwan Semiconductor Manufacturing Co., Ltd., Hsinchu (TW)

(72) Inventors: Chen-Tai Chen, Hsinchu (TW); Jing-Ran Lin, Hsinchu (TW); Jer-Shien Yang, Hsinchu (TW); Hung-Wen Chen, Hsinchu (TW); I-Ling Kuo, Hsinchu (TW); Yu-Hsun Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 938 days.

(21) Appl. No.: 17/027,508

(22) Filed: Sep. 21, 2020

(65) Prior Publication Data

US 2022/0093429 A1     Mar. 24, 2022

(51) Int. Cl.
| | |
|---|---|
| *H01L 21/67* | (2006.01) |
| *C23C 14/52* | (2006.01) |
| *C23C 16/44* | (2006.01) |
| *C23C 16/50* | (2006.01) |
| *C23C 16/52* | (2006.01) |

(Continued)

(52) U.S. Cl.
CPC .......... *H10P 72/0604* (2026.01); *C23C 14/52* (2013.01); *C23C 16/4401* (2013.01); *C23C 16/50* (2013.01); *C23C 16/52* (2013.01); *H01J 37/32449* (2013.01); *H01J 37/32972*

(2013.01); *H10P 72/0616* (2026.01); *H01J 2237/334* (2013.01); *H10P 72/0421* (2026.01)

(58) Field of Classification Search
CPC ....... H01L 21/67242–67294; H01L 22/00–34; H01J 37/32449; H01J 37/32908–3299; C23C 16/4401–4409; C23C 16/52; C23C 14/52–54

See application file for complete search history.

(56) References Cited

U.S. PATENT DOCUMENTS

| | | | | |
|---|---|---|---|---|
| 2003/0230551 A1* | 12/2003 | Kagoshima | ....... | H01L 21/32137 216/60 |
| 2004/0184028 A1* | 9/2004 | Fink | .................. | H01J 37/32862 356/72 |

(Continued)

OTHER PUBLICATIONS

Cardinaud, Christophe; Fluorine-based plasmas: Main features and application in micro-and nanotechnology and in surface treatment; Aug. 2018; Comptes Rendus Chimie, vol. 21, Issue 8; https://doi.org/10.1016/j.crci.2018.01.009 (Year: 2018).*

*Primary Examiner* — Christine S. Kim
*Assistant Examiner* — Tyler J Wiegand
(74) *Attorney, Agent, or Firm* — Seed IP Law Group

(57) ABSTRACT

The present disclosure provides a system and method for predicting wafer fabrication defects resulting from plasma processing of wafers in a plasma processing chamber. The system and method include processing electromagnetic signals emitted from residual compounds peeled from the chamber walls during the plasma processing of the wafers to indirectly determine the likelihood that the wafers are incurring fabrication processing defects during the plasma processing.

20 Claims, 9 Drawing Sheets

(51) Int. Cl.
    *H01J 37/32*          (2006.01)
    *H10P 72/00*         (2026.01)

(56)                References Cited

U.S. PATENT DOCUMENTS

2005/0070034 A1*   3/2005  Gibson, Jr.  ....... H01L 21/31138
                                                         257/E21.616
2005/0125090 A1*   6/2005  Sakano  ............ H01J 37/32862
                                                         700/121
2006/0000799 A1*   1/2006  Doh  .................... H01J 37/3299
                                                         257/E21.252
2017/0287791 A1*  10/2017  Coppa  .............. H01J 37/32697
2018/0076048 A1*   3/2018  Gohira  ............. H01L 21/67103
2019/0019734 A1*   1/2019  Jung  ...................... G01N 21/31
2020/0373210 A1*  11/2020  Chen  .................... G01J 3/0208

* cited by examiner

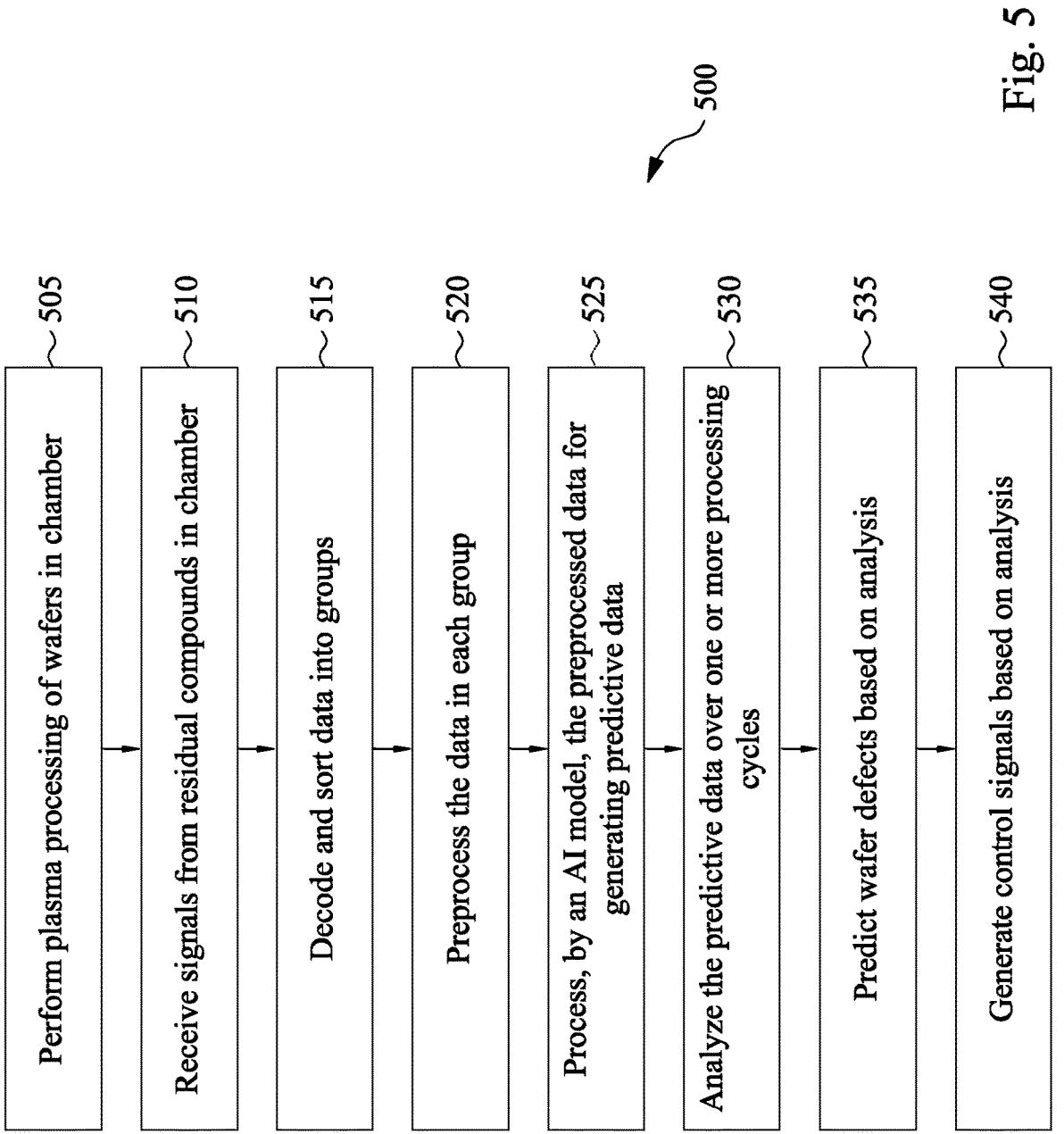

505 Perform plasma processing of wafers in chamber

510 Receive signals from residual compounds in chamber

515 Decode and sort data into groups

520 Preprocess the data in each group

525 Process, by an AI model, the preprocessed data for generating predictive data 530 Analyze the predictive data over one or more processing cycles 535 Predict wafer defects based on analysis 540 Generate control signals based on analysis

SYSTEMS AND METHODS FOR DETERMINING RESIDUAL COMPOUNDS IN PLASMA PROCESS

BACKGROUND

Integrated circuit (IC) fabrication utilizes a variety of processing steps, including etching and depositing films (i.e., layers) on masked wafers in order to create trenches, vias, metal lines, components of passive and active electrical circuits, such as capacitors, resistors, inductors, transistors, antennas, and in general forming insulating and conducting structures in the production of integrated circuits on batches of wafers formed of semiconductor substrate material.

One processing step includes plasma etching performed by applying electromagnetic energy, typically radio frequency (RF), to a gas containing a chemically reactive element, such as fluorine or chlorine. The plasma releases positively charged ions that bombard the wafer to remove (etch) materials and chemically reactive free radicals that react with the etched material to form volatile or nonvolatile byproducts. The electric charge of the ions directs them vertically toward the wafer. This produces the almost vertical etch profiles essential for the miniscule features in today's densely packed chip designs. Process chemistries differ depending on the types of films to be etched. Those used in dielectric etch applications are typically fluorine-based. Silicon and metal etch use chlorine-based chemistries. In reactive ion etching, the objective is to optimize the balance between physical and chemical etching such that physical bombardment (etch rate) is enough to remove the requisite material while appropriate chemical reactions occur to form exhausted volatile byproducts.

Other processing steps include non-plasma etching, chemical vapor deposition (CVD) and physical vapor deposition (PVD). These steps, as well as the above-described plasma etching steps, are performed using various precursor gases (i.e., reactive gases and/or reactive gas mixtures, and in some instances, reactive gases and their respective inert carrier gases) provided to a processing chamber that holds the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flowchart of a method for monitoring plasma processing of wafers in a plasma processing chamber for predicting wafer fabrication defects resulting from the plasma processing of the wafers in the plasma processing chamber of FIG. 1, according to an embodiment of the present disclosure;

DETAILED DESCRIPTION

Figure 1:
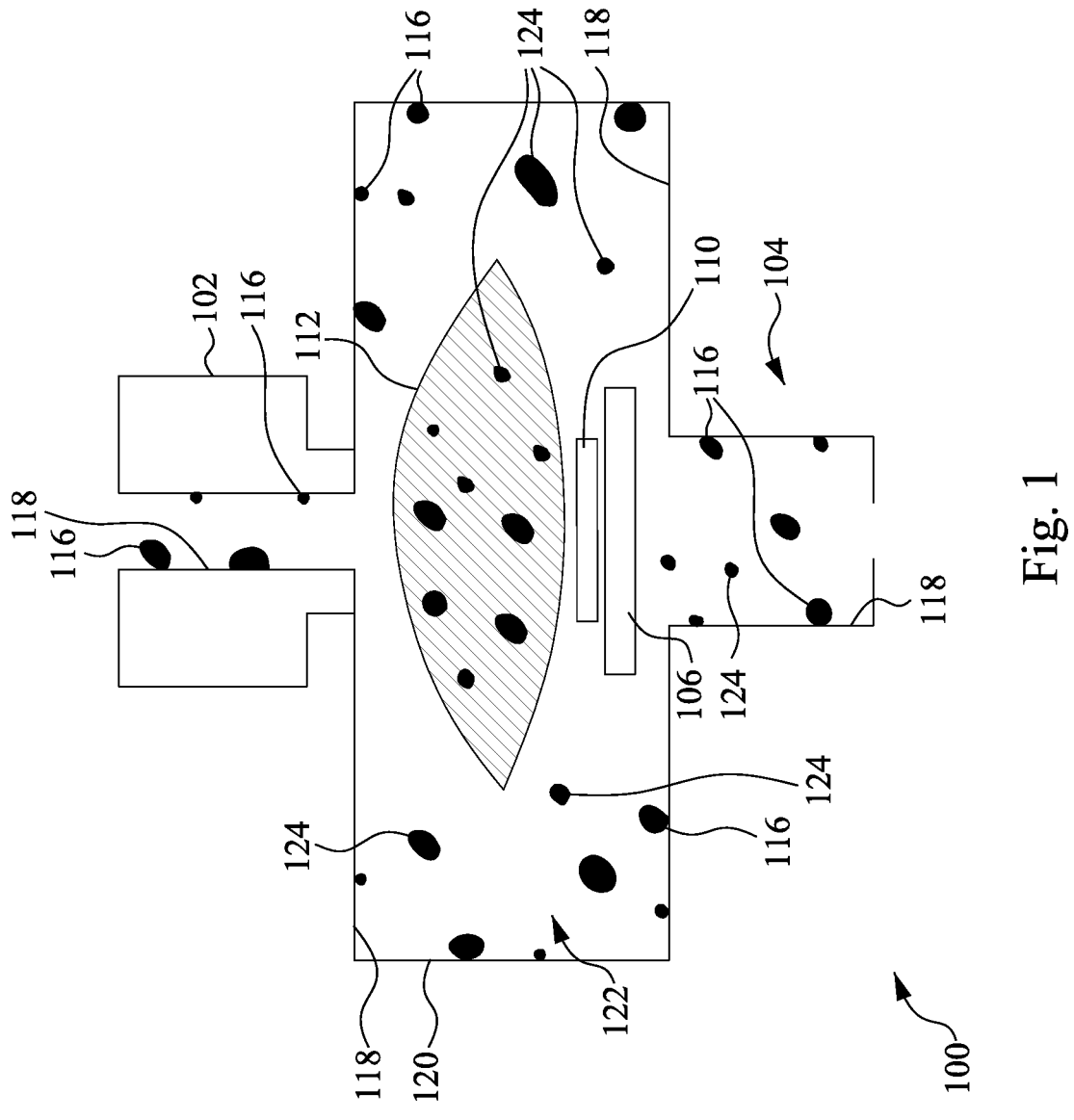
FIG. 1 illustrates a plasma processing chamber, according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafers are often processed in batches, called lots. Dependent upon the processing step, the wafers may be processed in a processing chamber, such as a plasma processing chamber. The processing chamber may be temperature and pressured controlled and may include ports for importing precursor (i.e., active) gases and exporting byproducts of the processing step(s), such as any residual gases. The processing chamber may also include electronics for creating a plasma from the gases imported to the chamber as part of one or more plasma processing steps. Processing chambers and associated components are well-known in the art and will not be described in greater detail.

The walls of the processing chamber, being exposed to a variety of byproducts resulting from the reaction of the precursor gases with the wafers or with other material substances in the chamber, for example material substances used in plasma sputtering processes, deteriorate (i.e. decay) over time. In the context of the present disclosure, deterioration of the chamber, and specifically the walls of the chamber, refers to the buildup of byproducts on the chamber walls, thereby reducing the effectiveness of the respective processing steps that produced such byproducts, and furthermore, causing the wafers to incur fabrication-induced defects that result in a reduction of the yields of the batches and a loss in production time and/or batches that typically results in the lag of time between production of a batch of wafers and the inspection of the wafers that periodically occur further downstream in the fabrication chain. It would be advantageous to know in real-time the risk of incurring fabrication-induced defects in a batch of wafers in order to mitigate losses of batches and fabrication time/materials due to defects, as well as tuning in real-time the fabrication system for mitigating such losses.

FIG. 1 illustrates a plasma processing chamber 100 including an injector 102 (also referred to as an injector port), an exhaust outlet (i.e., port) 104 and a chuck 106. The injector 102 is configured to receive one or more precursor (i.e., active) gases from a gas storage system (e.g., from one or more gas storage canisters, not shown) and control the flow of one or more of the active gases into the processing chamber 100. The chuck 106 is configured to receive a semiconductor substrate, e.g., a wafer 110, for subsequent processing of the wafer 110 in the processing chamber 100. The wafer 110 as illustrated may be a single wafer, such as a test wafer, or may represent a batch of wafers.

Although not shown, the processing chamber 100 includes plasma generating components, including electrodes and associated electronics for creating a plasma from the one or more active gases received through the injector port 102. During a plasma processing step, such as a chemical vapor deposition (CVD), a physical vapor deposition (PVD) or a dry etch, the wafer 110 is placed on the chuck 106, one or more active gases are introduced into the processing chamber 100, the flows of which are controlled via the injector 102, a plasma 112 is generated from at least one of the one or more active gases via plasma generating components of the plasma chamber 100 (e.g., at least one active gas is ionized through high voltage/current discharge between electrodes of the plasma generating components), and one or more plasma processing steps are performed on the wafer 110.

For example, layers of different material substances may be deposited on the wafer 110 and/or the wafer 110 may be etched to create vias and insulating and conducting patterns/structures. The patterns and/or structures to be etched or deposited are typically delineated by a mask. For example, wafers 110 are typically coated with a layer of photoresist and in some cases, other anti-reflective layers, and the mask is then exposed to UV light in a lithography processing step performed outside of the plasma processing chamber 100. The mask and those portions of the wafers 110 delineated by the mask are then etched in the plasma processing chamber 100 via a plasma processing step to create the insulating and conducting patterns/structures on the wafers 110.

Typically, several plasma processing steps may be performed on the wafers 110 before the plasma processing of the wafers 110 is complete. For example, the wafers 110 may be coated with a mask including a photoresist layer and several additional layers of different material substances (e.g., anti-reflective layers) requiring several different plasma processing steps (i.e., different precursor gases, temperatures, pressures, times) for completing the etch through those portions of the resist that have been exposed to UV radiation and the several underlying layers that are delineated by the pattern opened in the etched resist layer. Upon completion of the plasma processing of the wafers 110, the wafers 110 are removed from the processing chamber 100 and any remaining unetched mask may be removed from the wafers 110.

Byproducts of the plasma processing steps are typically evacuated from the processing chamber 100 via the exhaust port 104. However, some byproducts of the plasma process performed on the wafer 110 in the processing chamber 100 are not effectively evacuated from the chamber 100 through the exhaust port 104. For example, in some embodiments, some byproducts form polymers 116, and portions of such polymers 116 or polymers 116 themselves collect on the walls 118 of the processing chamber 100. In accordance with some embodiments, these portions of polymers 116 or portions thereof are deposited on walls 118 and in some embodiments adhere to walls 118. The chemical composition and thickness or concentration of the polymers 116 or portions thereof on the walls 118 of the chamber 100 may depend upon the how many times the processing chamber has been used since the walls 118 have last been cleaned to remove polymers 116 or portions thereof, the mix of active gases used in the different plasma processing steps, and/or the composition of materials composing the structures/layers of the wafer 110 and the composition of the substrate of the wafer 110, particularly if the substrate and any of the overlying structures/patterns are directly exposed to any of the plasma processing steps. As illustrated, portions of the polymers 116 may collect on the walls 118 of the injector 102, the walls 118 of a main chamber 120 of the processing chamber 100, and the walls 118 of the exhaust port 104.

Figure 2:
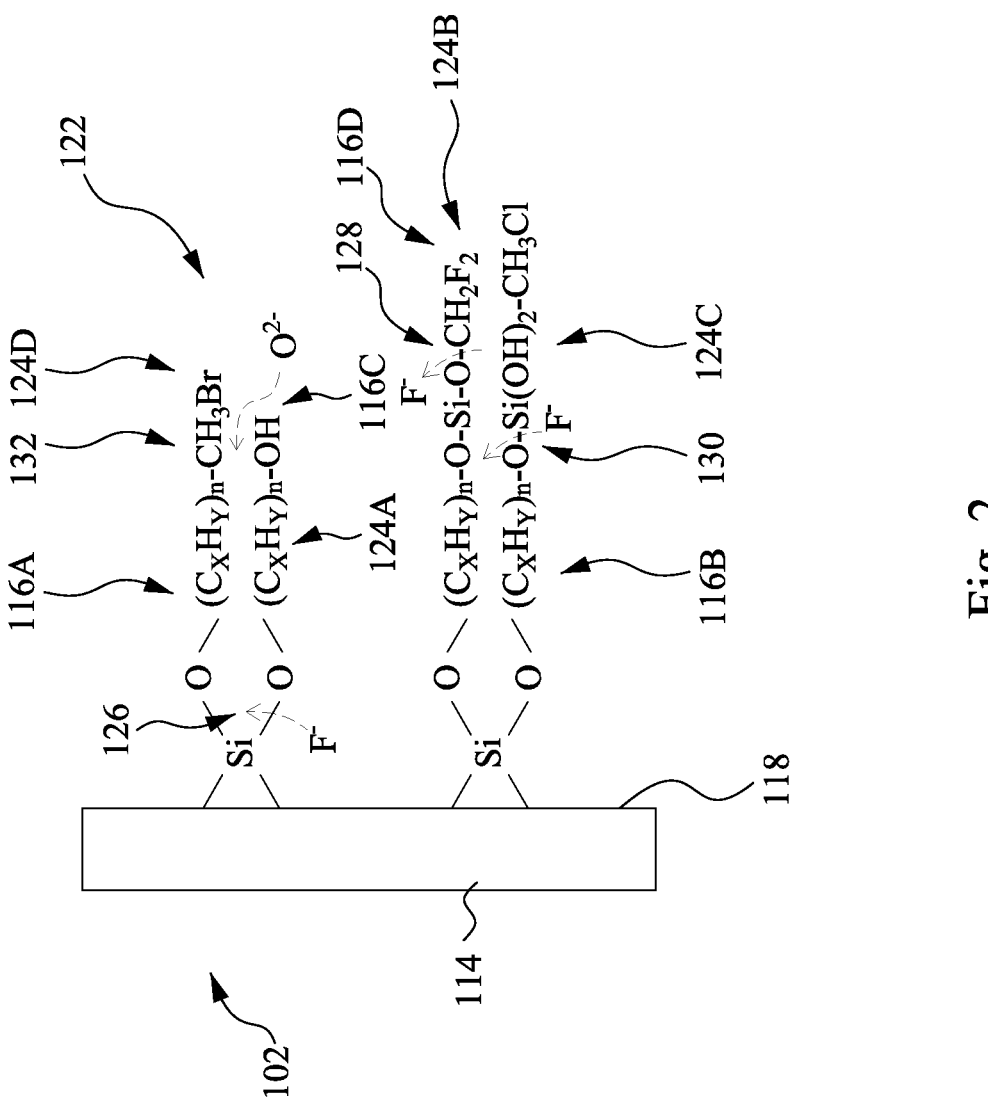
FIG. 2 illustrates a wall of an injector port of the plasma processing chamber of FIG. 1 upon which polymers have formed, according to an embodiment of the disclosure.

FIG. 2 illustrates a wall 118 of the injector 102 upon which portion of polymers 116 collect, according to an embodiment of the present disclosure. In the sense that the polymers 116 or portions thereof collect on the walls 118 of the processing chamber 100, the walls 118 define a chamber cavity 122 (FIGS. 1 and 2) in which the plasma 112 is contained. Although FIG. 1 illustrates the plasma 112 having an elliptical shape, the plasma 112 may have different shapes and may fill the entire chamber cavity 122.

In the exemplary embodiment as illustrated, a portion of polymers 116 collected on wall 118 include portion 116A having a hydrocarbon backbone and a bromomethane terminal moiety; portion 116B having a hydrocarbon backbone and a chloromethane terminal moiety; portion 116C having hydrocarbon backbone and a hydroxyl terminal moiety; and portion 116D having a hydrocarbon backbone and a difluoromethane terminal moiety. In the embodiment of FIG. 2, an end of the hydrocarbon backbone of portion 116A opposite the bromomethane terminal moiety, an end of the hydrocarbon backbone of portion 116B opposite the chloromethane moiety, an end of the hydrocarbon backbone of portion 116C opposite the hydroxyl terminal moiety and an end of the hydrocarbon backbone of portion 116D opposite the difluoromethane terminal moiety is linked to the wall 118 by an Si—O linkage. However, the scope of the present disclosure includes embodiments having portions of other polymers with different groups or combinations of groups. In addition, the polymers 116 may form on any of the walls 118 of the plasma processing chamber 100 that form the cavity 122 of the plasma processing chamber 100.

In operation, and for any particular processing step or series of processing steps selected by an operator, the wafer 110 (e.g., a batch of wafers 110) is placed in the plasma processing chamber 100 on the chuck 106, and depending upon the processing step(s), one or more active gases for each processing step is injected into the plasma processing chamber 100 via the injector port 102. In the present disclosure, an operator may be a human operator that controls the chamber 100 via a control panel (not shown) coupled to the chamber 100, or may be a machine operator (e.g., a computer, not shown) coupled to the chamber 100 that controls the chamber 100 via a series of preprogrammed algorithms. In any event, for each processing step, the plasma 112 is created in the plasma processing chamber 100 from an ionization of one or more gases of the one or more active gases, and the plasma processing step (e.g., etching or deposition) is performed on the wafer 110 for a given predetermined time period. Each plasma processing step may have different predetermined time periods.

During one or more of the plasma processing steps, some of the polymers 116 or portions of the polymers 116 may be removed (i.e., peeled) from the walls 118 of the plasma processing chamber 100 due to chemical reactions of the plasma 112 with the polymers 116 or portions thereof collected on walls 118. For example, and as illustrated in FIG. 2, when the plasma 112 is a fluorine-based plasma, some of the high energy fluorine ions F⁻ break some of the chemical bonds of the portions of polymers 116 collected on walls 118 or the Si—O linkage, resulting in portions of the polymers 116 being released into the cavity 122 of the plasma processing chamber 100. For the purposes of the present disclosure, the polymers 116 and the portions of polymers 116 released into the cavity chamber are referred to as residuals 124 or residual compounds 124. The polymers 116 are precursors to the portions of the polymer 116 that are released into the cavity chamber. The residual compounds 124 are generated in a gas phase, and in fact, may form part of the plasma 112. The residual compounds 124 may be ionized, or may become ionized, via interactions with the surrounding plasma 112. In some embodiments, the residual compounds are not ionized.

In creation of residuals 124, and as illustrated by the exemplary embodiment of FIG. 2, high energy fluorine ions F⁻ may break a Si—O bond 126, thereby creating a hydroxy-based residual 124A, or may break a O—C bond 128, thereby creating a difluoromethane-based residual 124B, or may break a Si—O bond 130, thereby creating a chloromethane-based residual 124C. In another embodiment, high energy ionized oxygen $O^{2-}$ may break a C—C bond 132, thereby creating a bromomethane-based residual 124D. As illustrated, the residuals 124A-124D include bromine, chlorine, carbon and fluorine elements, among other elements. Embodiments of the present disclosure are not limited to fluorine ions or oxygen ions breaking bonds of the polymer portions collected on walls 118. In accordance with embodiments of the present disclosure, bonds of the polymer portions collected on walls 118 are broken by ions other than fluorine ions or oxygen ions. In addition, embodiments in accordance with the present disclosure are not limited to only O—C bonds, C—C bonds or Si—O bonds being broken in order to release portions of polymers 116 from walls 118. In accordance with embodiments of the present disclosure, bonds other than O—C bonds, C—C bonds or Si—O bonds may be broken in order to release portions of polymers 116 from walls 118.

The residual compounds 124 may be further energized by the plasma 112, and thus bromine, chlorine, fluorine, oxygen and/or carbon ions may form a portion of the residuals 124 and/or may be placed in higher-energy atomic states for forming higher energy state molecular residual 124. Each of the residuals 124 has a unique optical emission spectrum, dependent upon the energy states in which electrons of the residual can inhabit. For example, when an electron of bromine is excited into a higher-energy orbit (i.e., higher energy state), the residual bromine ion (or bromine-based residual) emits a particular wavelength of light (also referred to as emitting an electromagnetic signal having a particular wavelength) when the electron relaxes into a lower orbit or lower energy state. Thus, for a given set of polymers 116 adhered to the walls 118 of the chamber 100, and for a given thickness or concentration of the given set of polymers 116 adhered to the walls 118, and for given one or more plasma processing steps being performed on a batch of wafers 110, a unique spectra of electromagnetic radiation will be emitted from the residuals 124 that have been released (i.e., peeled) from the walls 118 of the plasma processing chamber 100. The intensity of an electromagnetic signal of a given wavelength will depend on the concentration of the residual 124 emitting the signal, which is turn depends upon the amount (i.e., concentration) of the polymer 116 that is the precursor to this residual 124 adhered to the walls 118 of the plasma processing chamber 100 prior to initiating the plasma processing step(s).

When a large amount or concentration of one or more residuals 124 is generated in the plasma processing chamber 100 during one or more plasma processing steps, there is an increased risk that the residuals 124 will interfere with the plasma processing steps, leading to increased wafer fabrication defects.

FIGS. 3A-D show a development of a wafer fabrication defect caused by the generation of residuals in the plasma processing chamber during one or more plasma processing steps, according to an embodiment of the present disclosure. Although FIGS. 3A-D illustrate a wafer fabrication etching defect, the scope of the present disclosure covers wafer fabrication deposition defects caused by the presence of residual compounds in the plasma processing chamber during plasma processing deposition steps, according to the same principles described below in conjunction with FIGS. 3A-D.

Figures 3A, 3B, 3C:
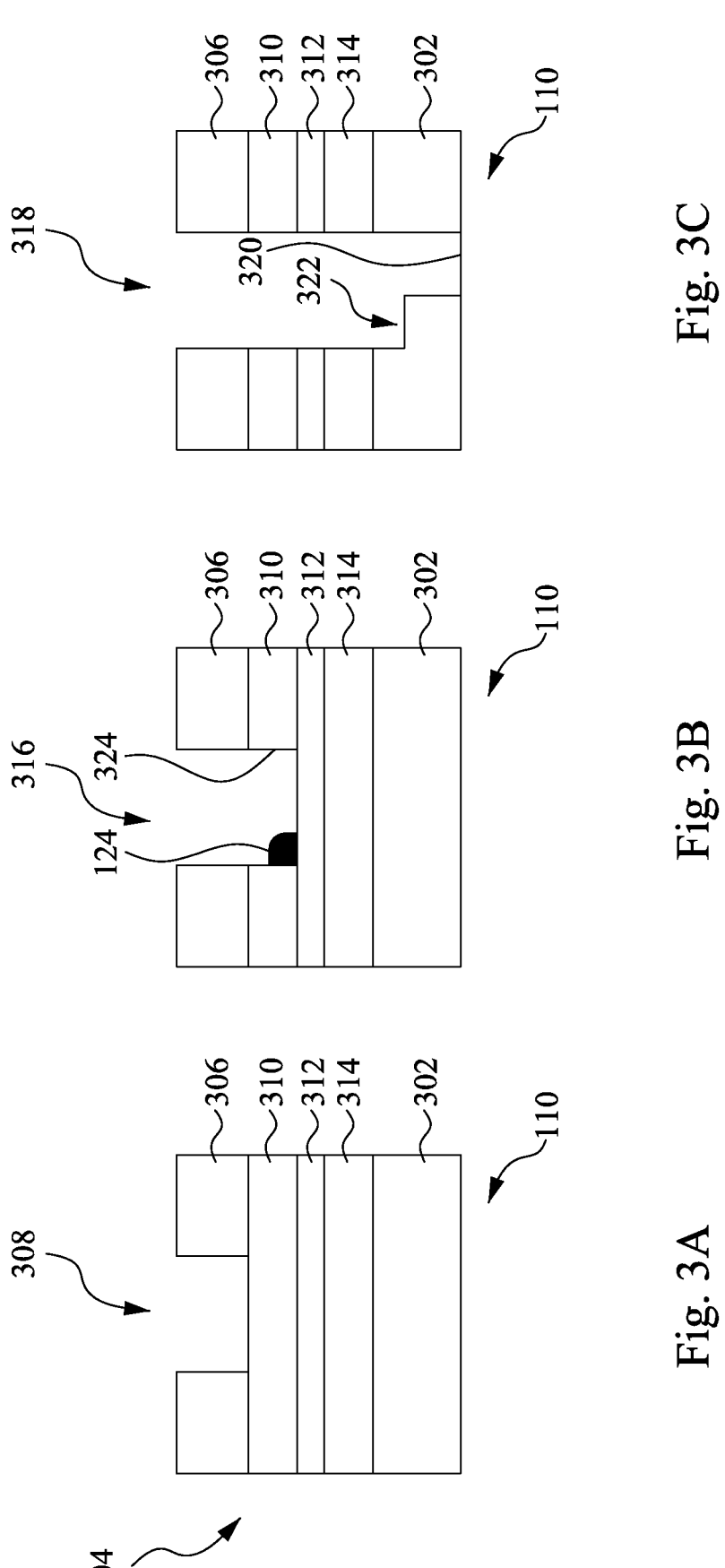
FIG. 3A illustrates a wafer having a polysilicon layer that is to be etched in the plasma processing chamber of FIG. 1 to form polysilicon patterns and/or polysilicon structures, according to an embodiment of the disclosure.
FIG. 3B illustrates the result of performing a first etch processing step on the wafer of FIG. 3A, according to an embodiment of the present disclosure.
FIG. 3C illustrates the result of performing one or more further etch processing steps on the wafer of FIG. 3B, according to an embodiment of the present disclosure.

FIG. 3A illustrates the wafer 110 having a polysilicon layer that is to be etched to form polysilicon patterns and/or polysilicon structures, according to an embodiment of the present disclosure. Plasma etching is an integral part of semiconductor integrated circuit (IC) processing and is widely used to produce high-resolution patterns and to remove sacrificial layers. The wafer 110 includes a polysilicon layer 302 covered with a mask 304. The mask 304 includes a layer of photoresist 306 having openings 308 defined and created by a previous lithography processing step, and a bottom anti-reflective coating (BARC) layer 310 positioned under the resist 306 used for absorbing light to minimize reflectivity and enhance critical dimension (CD) and uniformity during the lithography processing step. The resist layer 306 forms a high-resolution pattern defined by the openings 308 created by the previous lithography processing step.

In addition, the mask 304 may optionally include a silicon oxynitride (SiON) layer 312 positioned directly under the BARC layer 310 and a further anti-reflective dielectric (ARD) layer 314 positioned between the SiON layer 312 and the polysilicon layer 302. In some embodiments, the SiON layer 312 is used as a masking, or etch stop. However, in other embodiments, the SiON layer 312 may be employed as an insulator and as a diffusion barrier in some ultra-large-scale integration (VLSI) processes. In one embodiment, the ARD layer 314 may be a second SiON layer 312, however in other embodiments, the ARD layer 314 may be formed of ARD layers known in the art. The scope of the present disclosure includes the mask 304 being formed of only the resist layer 306 and the mask being formed of the resist layer 306 and any combination of one or more of the BARC 310, SiON 312 and ARD layers 314.

FIG. 3B illustrates the result of performing a first etch processing step on the wafer 110 of FIG. 3A, according to an embodiment of the present disclosure. The first etch processing step uses one or more active gases and a plasma generated from the active gases to etch through the BARC layer 310. As illustrated, the etching performed by the first etch processing step is halted at the SiON layer 312, due to the material composition of the SiON layer and the composition of the active gases used in the first etch processing step. The first etch processing step creates a first etching well 316.

FIG. 3C illustrates the result of performing one or more further etch processing steps on the wafer of FIG. 3B, according to an embodiment of the present disclosure. The further etch processing steps may be performed with different active gases or different combinations of active gases for etching the SiON layer 312, the ARD layer 314 and the polysilicon layer 302 to form the desired patterns and/or lines in the polysilicon layer 302. The further etch processing steps result in a second well 318 being created having a bottom surface 320. However, as illustrated, a wafer fabrication defect 322 is generated as a result of interference of the further etch processing steps by the residual compound 124 (FIG. 3B) that is bonded to a surface 324 of the first etched well 316.

That is, the residual compound 124 has adhered (i.e., chemically bonded) itself to the surface 324 (i.e., a bottom surface or side surface) of the first etched well 316 during the first etch processing step. However, during subsequent etch processing steps, in which a pattern defined by the mask 304 is etched into the polysilicon layer 302, the presence of the residual compound 124 in the first etched well 316 prevents that pattern to be fully defined by blocking or impeding the plasma to chemically react with the silicon oxynitride layer 312, the ARD layer 314 and/or the polysilicon layer 302. FIG. 3C illustrates the patch of polysilicon 322 that was not fully etched away, thereby resulting in defects in the resulting polysilicon pattern.

Figure 3D:
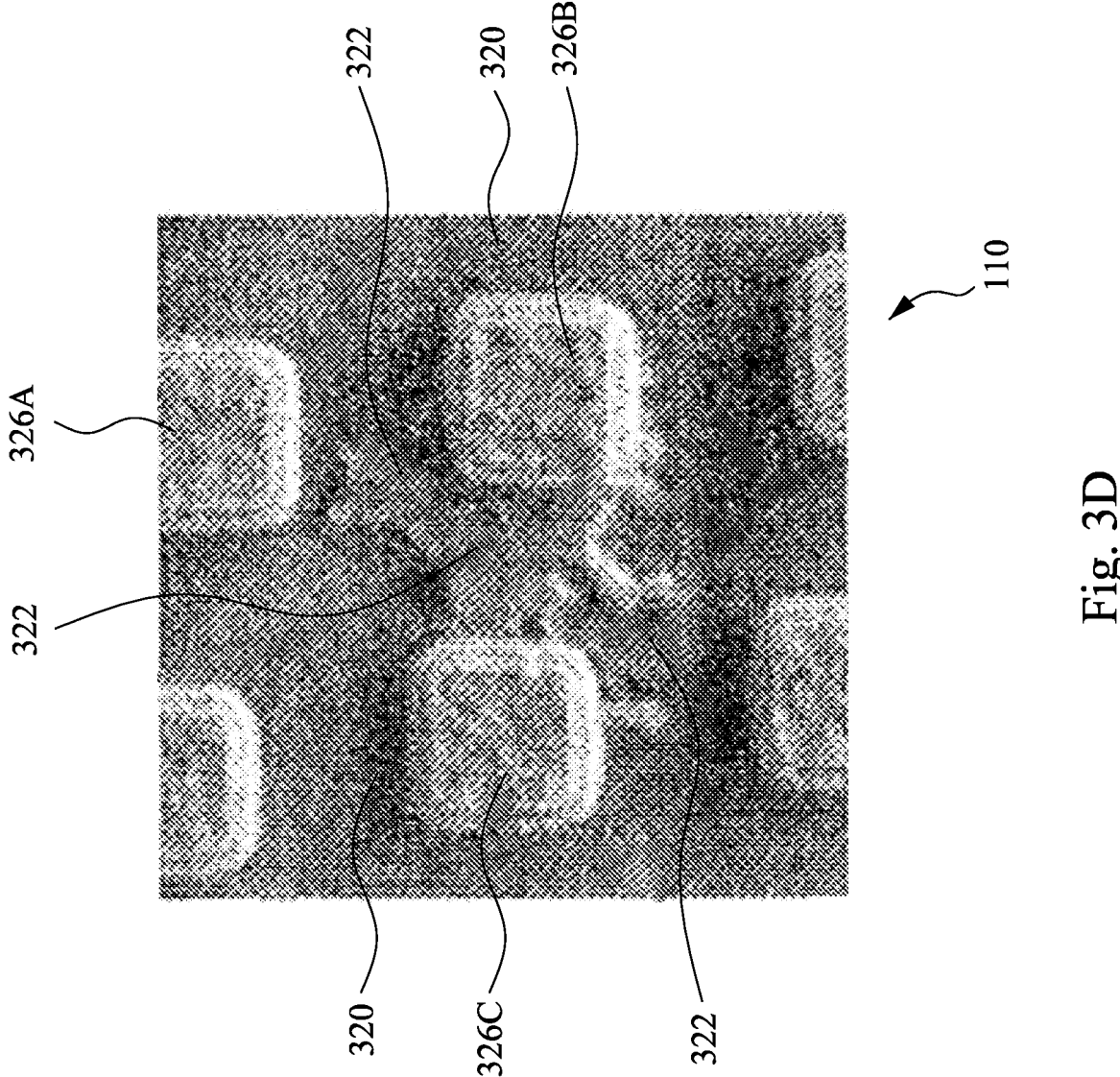
FIG. 3D illustrates an overhead view of the etched wafer of FIG. 3C, according to an embodiment of the present disclosure.

FIG. 3D illustrates an overhead view of the etched wafer 110 of FIG. 3C, according to an embodiment of the present disclosure. FIG. 3D illustrates polysilicon structures 326 (formed from the polysilicon layer 302) and patches of polysilicon 322 (i.e., wafer fabrication defects) that are positioned on the surface 320. Although all the polysilicon structures 326 should be electrically isolated from one another, as are structures 326A and 326B, the patches of polysilicon 322 electrically couple the adjacent structures 326B and 326C. The polysilicon patches 322 are only one exemplary embodiment of a wafer fabrication processing defect resulting from the generation and presence of residual compounds 124 in the processing chamber 100 during plasma processing of the wafers 110.

The probability of wafer fabrication defects occurring is related to the concentration of residual compounds 124 in the plasma processing chamber 100 during the plasma processing steps. For example, the probability (or risk) of generating wafer fabrication defects on one or more wafers 110 during plasma processing of the one or more wafers is higher when the concentration of one or more of the residual compounds 124 in the plasma processing chamber 100 is higher. In one embodiment of the present disclosure, a system detects the probable existence of wafer fabrication defects based upon an analysis of electromagnetic signals emitted by the residual compounds 124 during the plasma processing steps. By utilizing the results of detecting the probably existence of wafer fabrication defects, embodiments in accordance with the present disclosure can provide a prediction of the presence of wafer fabrication defects.

Figure 4:
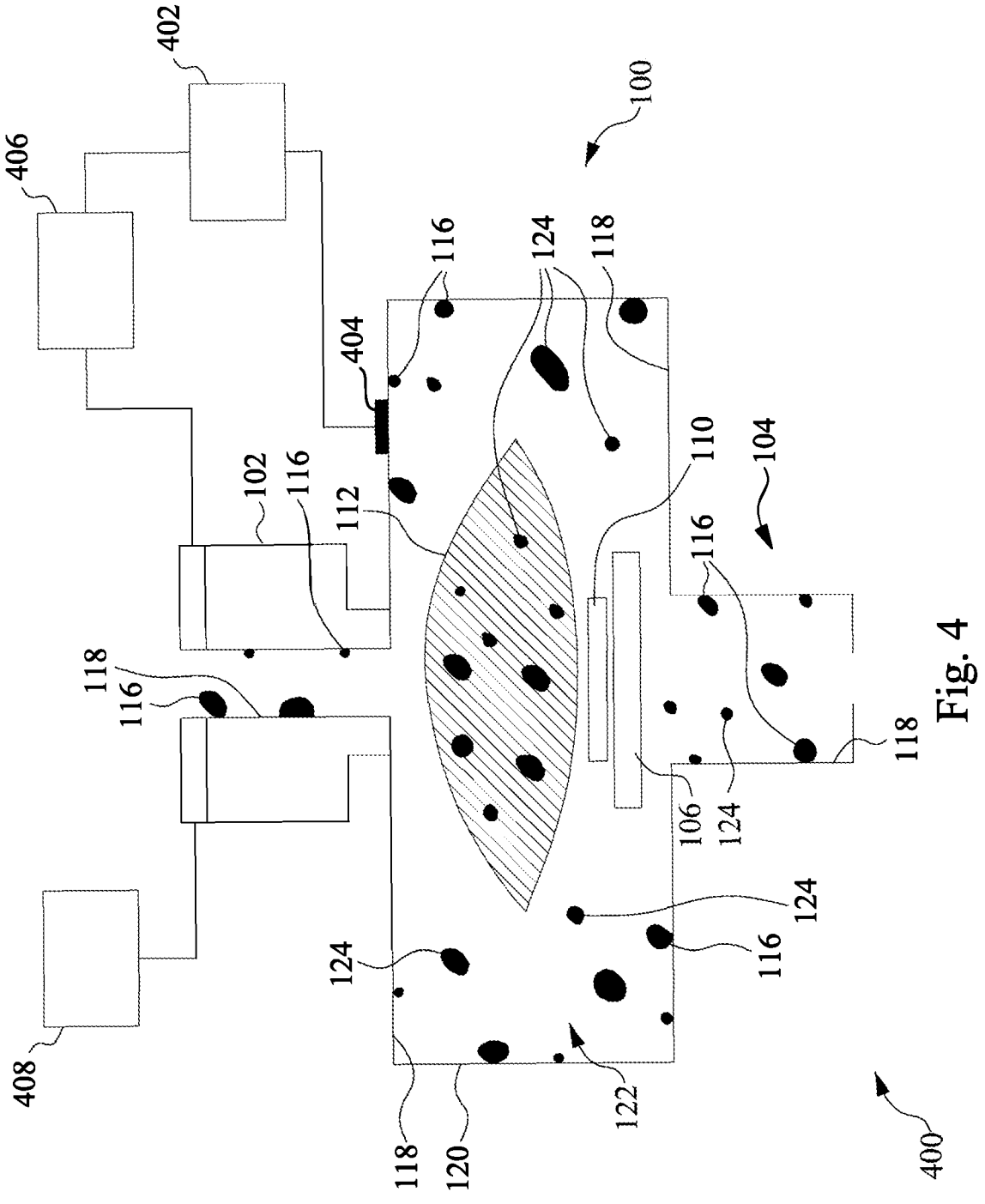
FIG. 4 illustrates a system for determining wafer fabrication defects resulting from plasma processing of wafers in the plasma processing chamber of FIG. 1, according to an embodiment of the present disclosure.

FIG. 4 illustrates a system 400 for determining wafer fabrication defects resulting from plasma processing of wafers in the plasma processing chamber 100 of FIG. 1, according to an embodiment of the present disclosure. The system 400 includes the plasma processing chamber 100 and an optical emission spectrometer 402 coupled to plasma processing chamber 100. Optical emission spectrometers are well known in the art and will not be discussed in further detail in the presence disclosure.

In one embodiment, the plasma processing chamber 100 includes a window 404, and the optical emission spectrometer 402 is coupled to the window 404 or to a portion of the plasma processing chamber centered on the window 404. The optical emission spectrometer 402 is configured to receive, via the window 404, electromagnetic radiation (i.e., electromagnetic signals) emitted by one or more residual compounds 124 in the plasma processing chamber 100 during plasma processing of the wafers 110 in the plasma processing chamber 100. As discussed above, each received signal (having a unique wavelength) is emitted by a corresponding unique residual compound 124 in the processing chamber 100. The optical emission spectrometer 402 identifies the residual compounds 124 by their corresponding optical signatures (i.e., spectrum defined by their wavelengths), based upon known optical signatures of atoms, ions, and molecular compounds, collectively referred to as optical signatures of known chemical species, that result from transitions of the species from one or more excited energy states to one or more lower energy states. The wavelengths of electromagnetic energy that comprise the spectrum which identifies the residual compounds include wavelengths within visible light and ultraviolet light spectrums and wavelengths outside the visible light and ultraviolet light spectrums.

In one embodiment of the present disclosure, the optical emission spectrometer 402 is configured to analyze the received electromagnetic signals over a time period for determining wafer fabrication defects. In an embodiment, the time periods are predefined based upon lengths of time of the plasma processing steps. In one embodiment, the time period is equal to the length of time of a single plasma processing step. Since the length of time of any given plasma processing step depends upon the type of plasma processing being performed on the wafer 110, the time periods over which received electromagnetic signals are analyzed depend upon the type of plasma processing steps being performed on the wafers 110.

In another embodiment of the present disclosure, the optical emission spectrometer 402 may include an I/O module (not shown) including, for example, a display, a keypad and one or more communication ports for coupling to external devices, such as external displays, laptops, printers and/or controllers, such as actuators.

In another embodiment, the system 400 includes a controller 406 coupled to the injector port 102 and the optical emission spectrometer 402. The controller 406 may include one or more of a processing unit, memory, hard disk, I/O, energy source, and may be implemented as chip (such as a microcontroller), an expansion card, or a stand-alone device. In one embodiment of the present disclosure, the controller is an actuator 406 configured to receive control signals from the optical emission spectrometer 402, and power from an external power source (not shown), such as an external current or external voltage, and convert the received power into motion of mechanical components, such as valves, for controlling the flow of active gases through the injector port 102. The conversion of the received power into motion of mechanical components may be based upon control signals received from the optical emission spectrometer 402.

In one embodiment, the actuator 406 includes one or more mechanical valves or other gas flow mechanisms (not shown) that are coupled to (i.e., integrated with) the injector port 102 for controlling the flow of one or more active gases through the injector port 102 into the plasma processing chamber 100. In another embodiment, the injector port 102 includes one or mechanical valves or other gas flow mechanisms (not shown) which are controlled by an output of the actuator, such as a pneumatic or electrical output, for controlling the flow of the active gases through the injector port 102 into the plasma processing chamber 100.

Actuators typically require control signals and a source of power. The control signal is relatively low energy and may be an electric voltage or current, pneumatic or hydraulic pressure, or even human power. The power source may be, for example, a relatively higher energy signal, such as a higher power electric current or voltage, or a higher power hydraulic fluid or pneumatic pressure. As is known in the art, actuators operate by receiving control signals and using the control signals to control (e.g., trigger) the conversion of energy received from a power source into mechanical motion of components, such as valves, switches, levers, etc.

In one embodiment, the controller 406 is a component of optical emission spectrometer 402, such that the optical emission spectrometer 402 is configured to generate one or more control signals based on the analysis of the received electromagnetic signals over the time period corresponding to the length of time of a plasma processing step, or alternatively, over a plurality of time periods, where each time period corresponds to a length of time of an associated plasma processing step.

In another embodiment of the present disclosure, the injector port 102 of the plasma processing chamber 100 is coupled to a one or more gas canisters 408. The gas canisters 408 contain one or more active gases to be used in one or more of the plasma processing steps. The term "active gas" used herein also covers any carrier or inert gases used with the active gases to create the plasma 112 and the chemical reactions of the plasma with the wafers 110 in carrying out the plasma processing step(s). The actuator 406 is configured to receive the control signals from the optical emission spectrometer 402 and regulate a flow of the active gases from the gas canisters 408 through the injector port 102 based on the received control signals.

In one embodiment, the plasma processing chamber 100 is configured to receive one or more active gases from the gas canisters 408 including one or more of sulfur hexafluoride, carbon tetrafluoride, trifluoromethane, chlorine, boron trichloride, hydrogen bromide, and octafluorocyclobutane. Embodiments of the present disclosure are not limited to these active gases. Embodiments of the present disclosure can utilize active gases other than the gases described above. The plasma processing chamber 100 is configured to generate the plasma 112 from the one or more active gases for performing plasma processing of the wafers 110.

In another embodiment, the optical emission spectrometer 402 is configured to analyze the received electromagnetic signals over the time period by integrating, for each received electromagnetic signal having a corresponding wavelength, an intensity of the received electromagnetic signal over the time period. In one embodiment, the time period is the length of time of a plasma processing step. In other embodiments, the time period is a length of time that is greater than or less than the length of time of a plasma processing step. The optical emission spectrometer 402 may then compare the integrated intensity of each of the received electromagnetic signals having unique wavelengths and corresponding to a particular residual compound 124 in the plasma processing chamber 100 with predefined one or more intensity thresholds for the unique wavelengths stored in a memory or hard disk of the optical emission spectrometer 402 for determining the presence of wafer fabrication defects. In one embodiment, determining of the presence of wafer fabrication defects is determining a likelihood of occurrence of wafer fabrication defects.

In one embodiment, depending upon whether the integrated intensity is below, between or above predefined intensity thresholds, the optical emission spectrometer 402 may generate an visual output via an I/O display for an operator to view and/or generate control signals for controlling the flow of one or more of the active gases into the plasma processing chamber 100 via the injection port 102. The operator may decide to stop the plasma processing of the wafers 110 in the plasma processing chamber 100, clean the plasma processing chamber 100 of the polymers 116 adhered to the walls 118 of the chamber 100, or adjust the flow of the active gases into the plasma processing chamber 100 to mitigate the risk or probability of the wafers 110 incurring fabrication defects. The optical emission spectrometer 402 may in addition, or alternatively, depending upon whether the integrated intensity is below, between or above predefined intensity thresholds generate control signals for controlling the actuator 406 to adjust the flow of the active gases into the plasma processing chamber 100 to mitigate the risk or probability of the wafers 110 incurring fabrication defects, or to stop the flow of active gases into the chamber 100 such that the polymers 116 may be cleaned from the chamber walls 118. The scope of the invention covers an operator taking other steps as a result of the results of the analysis of the electromagnetic signals by the optical emission spectrometer 402, such as inspecting the wafers 110 more carefully after the plasma processing steps have been completed to check for any wafer defects caused by the plasma processing steps.

In another embodiment, the optical emission spectrometer 402 is configured to analyze the received electromagnetic signals over consecutive time periods, including integrating, for each received electromagnetic signal having a corresponding wavelength, an intensity of the received electromagnetic signal over each consecutive time period. The optical emission spectrometer 402 then compares consecutively integrated intensities of each of the received electromagnetic signals having unique wavelengths and corresponding to a particular residual compound 124 in the plasma processing chamber 100 for determining the presence (e.g., likelihood) of wafer fabrication defects.

For example, in one embodiment the optical emission spectrometer 402 may compare consecutively integrated intensities of each of the received electromagnetic signals having unique wavelengths and corresponding to a particular residual compound 124 in the plasma processing chamber 100 to determine the percentage change between consecutive integrated intensities. If any of the percentage changes between consecutively integrated intensities exceed, are between, or are below any of one or more predefined thresholds stored in a memory or hard disk of the optical emission spectrometer 402, the optical emission spectrometer 402 may generate a visual output via an I/O display for an operator to view and/or generate control signals for controlling the flow of one or more of the active gases into the plasma processing chamber 100 via the injection port 102.

In one embodiment, if any of the percentage changes between consecutively integrated intensities for any given signal having a unique wavelength are above a predefined threshold associated with the given signal having the unique wavelength, the operator may decide to stop the plasma processing of the wafers 110 in the plasma processing chamber 100, clean the plasma processing chamber 100 of the polymers 116 adhered to the walls 118 of the chamber 100, or adjust the flow of the active gases into the plasma processing chamber 100 to mitigate the risk or probability of the wafers incurring fabrication defects. The optical emission spectrometer 402 may in addition, or alternatively, if any of the percentage changes between consecutively integrated intensities for any given signal having a unique wavelength are above a predefined threshold associated with the given signal having the unique wavelength, generate control signals for controlling the actuator 406 to adjust the flow of the active gases into the plasma processing chamber 100 to mitigate the risk or probability of the wafers 110 incurring fabrication defects, or to stop the flow of active gases into the chamber 100 such that the polymers 116 may be cleaned from the chamber walls 118. The scope of the invention covers an operator taking other steps as a result of the results of the analysis of the electromagnetic signals by the optical emission spectrometer 402, such as inspecting the wafers 110 more carefully after the plasma processing steps have been completed to check for any wafer defects caused by the plasma processing steps.

In one embodiment of the present disclosure, the predefined thresholds for percentage changes between consecutively integrated intensities for any given signal having a unique wavelength are about 3% to about 10%. Embodiments in accordance with the present disclosure where the predetermined threshold for percentage changes between consecutively integrated intensities is set to be within the foregoing range mitigate the risk or probability of processed wafers incurring fabrication defects. Embodiments in accordance with the present disclosure are not limited to using predefined thresholds that are about 3% to 10%. In accordance with embodiments of the present disclosure, the predefined thresholds may be less than 3%, or greater than 10%. In another embodiment, the optical emission spectrometer 402 is configured to analyze the received electromagnetic signals having wavelengths of one or more of 425 nm, 520 nm, 655 nm, 750 nm, 822 nm and 830 nm. Embodiments in accordance with the present disclosure are not limited to optical emission spectrometers configured to analyze the received electromagnetic signals having these wavelength. Embodiments in accordance with the present disclosure include optical emission spectrometers configured to analyze electromagnetic signals different from these listed wavelengths.

FIG. 5 is a flowchart of a method 500 for monitoring plasma processing of wafers 110 in a plasma processing chamber 100 for predicting wafer fabrication defects resulting from the plasma processing of the wafers in the plasma processing chamber, according to an embodiment of the present disclosure.

In step 505, plasma processing is performed on wafers 110 in a plasma processing chamber 100. In one embodiment, the plasma processing may include only a single plasma processing step, and in other embodiments, the plasma processing may include a plurality of plasma processing steps, typically performed serially, including inter-processing pauses, to achieve a desired etching or deposition of materials of the wafers.

In step 510, electromagnetic signals emitted by one or more residual compounds in the plasma processing chamber are received. In one embodiment, the optical emission spectrometer 402 receives the signals. The signals have corresponding wavelengths.

In an embodiment, the plasma processing chamber 100 receives one or more active gases including one or more of sulfur hexafluoride, carbon tetrafluoride, trifluoro methane, chlorine, boron trichloride, hydrogen bromide, and octafluorocyclobutane, dependent upon the desired or predetermined plasma processing step, or sequence of plasma processing steps. The plasma processing chamber 100 generates a plasma from the received one or more active gases, and the wafers 110 subsequently undergo the determined plasma processing step(s). During plasma processing of the wafers 110, one or more residual compounds are generated from chemical reactions between the plasma 112 and the polymers 116 that coat the walls 118 of the chamber 100. The polymers 116 coating the walls 118 of the chamber 100 are chemically bonded to the walls 118 after being formed as byproducts from previous plasma processing step(s). In one embodiment, the one or more residual compounds 124 are in a gaseous state and when generated, may be formed as ionized and/or high-energy state atomic or molecular components of the plasma 112. The optical emission signals emitted by the residual compounds 124 have wavelengths that correspond to the transition of electrons form high energy orbitals to lower energy orbitals.

In one embodiment, the residual compounds 124 include compounds having one or more of bromine, chlorine, carbon and fluorine. In another embodiment, the received electromagnetic signals have wavelengths corresponding to at least one of 425 nm, 520 nm, 655 nm, 750 nm, 822 nm and 830 nm.

In step 515, the received signals, also referred to as received data, are decoded, and then sorted into groups of data. For example, in one embodiment, the optical emission spectrometer 402, or alternatively a data processing system (not shown) coupled to the optical emission spectrometer 402, decodes the received electromagnetic signals emitted by one or more residual compounds in the plasma processing chamber 100 by filtering the received signals to include (i.e., to pass) only those signals having wavelengths in a predefined spectrum. For example, in one embodiment, the predefined spectrum includes signals (i.e., data) having wavelengths between 300-900 nm, or alternatively, 300-800 nm. However, the predefined spectrum may be defined by, and dependent upon, the knowledge of the operator of the system 400, including how many plasma processing steps, and the types of plasma steps, were previously performed in the chamber 100 (e.g., steps performed since the processing chamber was last cleaned), and which may further depend upon the composition of gases used and/or the composition of the wafers 110 (e.g., types of substrate, types and numbers of deposited layers, metallization, etc.) for each of the previous processing steps. In one exemplary embodiment, the predefined spectrum includes n data, such as n=2048 data (i.e., 2048 signals, each having a corresponding wavelength).

Each signal of a corresponding wavelength may be optionally further decoded by converting the received electric and/or magnetic fields of each signal into signal intensity, or other metrics that represent the physical characteristics of the signals.

The optical emission spectrometer 402, or alternatively a data processing system (not shown) coupled to the optical emission spectrometer 402, then optionally sorts the decoded signals into groups representing corresponding processing steps. For example, if a processing cycle performed on the wafers 110 in the processing chamber 100 includes m processing steps, where m is an integer greater or equal to 1, then each of the signals are sorted into one of m groups (also referred to as bins). That is, in the exemplary embodiment described above in which n=2048 and m=16, for example, each of the signals of the 2048 signals that were generated during the fourth processing step of the 16 processing steps are assigned to bin four of the 16 bins.

In step 520, each of the signals in each of the bins is preprocessed. In one embodiment, the optical emission spectrometer 402 preprocesses the signals, or alternatively a data processing system (not shown) coupled to the optical emission spectrometer 402 preprocesses the signals. For example, according to an embodiment of the present disclosure, each of the signals in each of the bins is integrated over the length of time (i.e., the period) of the processing step corresponding to the bin, or alternatively, over a portion of the period of the processing step corresponding to the bin. In other words, the area under each signal as a function of time, during the period of the processing step that generated the signal, is computed. Furthermore, each integrated signal (i.e., value of each integrated signal) is optionally normalized by a metric of an inert gas present in the chamber 100 during the processing step, such as pressure of the inert gas in the chamber 100, or volume of inert gas provided to the chamber 100 as measured at standard temperature and pressure (STP), for example.

In step 525, an artificial intelligence (AI) model receives and processes the n×m preprocessed data for reducing the quantity of data to those data that are the most statistically significant for further processing. In one embodiment of the present disclosure, a random forest AI model is used to process the preprocessed data, although the scope of the disclosure covers other AI models, such as, for example, DT, KNN and Naïve AI models. Random forest, DT, KNN and Naïve AI models are well known to those of skill in the art and will not be described hereinafter in further detail.

According to an embodiment of the present disclosure, the AI model is configured to process, for each data of the n×m data: peak intensities (e.g., peak intensity values and/or numbers of peak intensity), duration, intensity patterns (e.g., metrics associated with repeating patterns, such as frequencies of patterns, configuration, correlation to other wavelengths) and/or correlation to other data, for reducing the amount of data (i.e., the n×m data) to a statistically significant data set that are most predictive for determining the probability of the presence of fabrication defects on the wafers 110 (e.g., defects on or in the semiconductor substrate).

In one embodiment, the AI model processes, for each data (i.e., signal) of the 2048 data (i.e., 2048 signals), and for each processing step of the m processing steps, an accuracy metric. For example, the AI model may generate an accuracy metric that is greater than 0.76, for the data having a wavelength of 822 nm received during each of the processing steps, whereas the AI model may generate an accuracy metric that is less than 0.45, for the data having a wavelength of 428 nm received during each of the processing steps. In embodiments of the present disclosure, if the accuracy metric, or an average of the accuracy metric, is greater or equal to a predefined accuracy metric threshold during a processing cycle for a given data corresponding to a particular wavelength, then the given data is considered to be predictive for determining the probability of the presence of fabrication defects on the semiconductor substrate. Those data that are determined to be predictive are collectively referred to as predictive data.

Those data having generated accuracy metrics, or average accuracy metrics, that are less than the predefined accuracy metric threshold during the processing cycle are considered to be non-predictive for determining the probability of the presence of fabrication defects on the semiconductor substrate. In one embodiment, the predefined accuracy metric threshold is defined by an operator of the system 400, and is dependent upon the type of AI model used, and may also be dependent upon bandwidth of the predefined spectrum and/or the type of plasma processing steps performed in the processing chamber 100.

Figure 6:
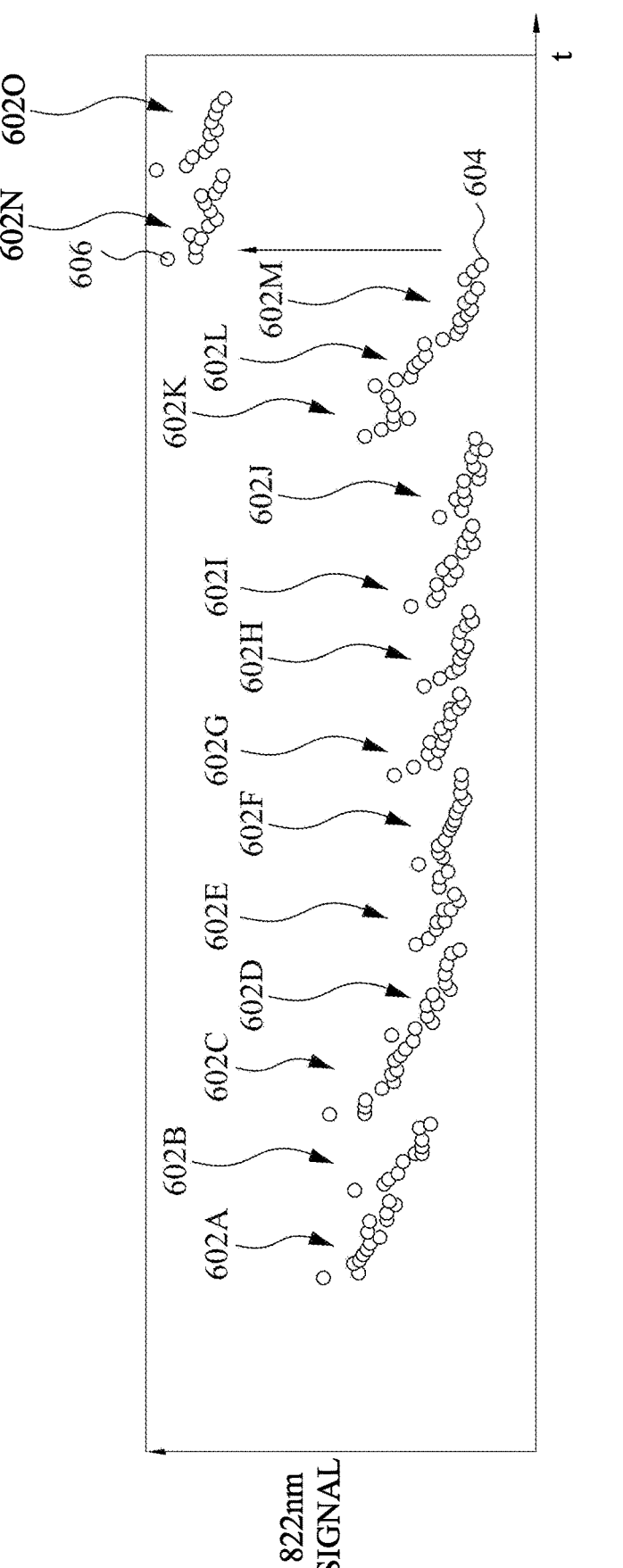
FIG. 6 illustrates an analysis of a 822 nm data signal, according to an embodiment of the present disclosure.

In step 530, the predictive data are analyzed over one or more processing cycles. For example, FIG. 6 illustrates an analysis of the 822 nm data signal (integrated and normalized according to step 520), according to an embodiment of the present disclosure. FIG. 6 illustrates 15 processing cycles 602A, 602B . . . 602O, and each processing cycle has m=16 processing steps. Each processing step of a processing cycle is represented by an oval circle. In one embodiment, the optical emission spectrometer 402 analyzes only those integrated, normalized signals that are determined to be predictive by the AI model over the m processing steps for each of the cycles, for example the 822 nm data signal in this embodiment. In one embodiment, the optical emission spectrometer 402 analyzes a predictive signal, e.g., the 822 nm data signal, by comparing the integrated and normalized signal at consecutive processing steps for determining a percentage change in the signal over consecutive processing steps. As discussed previously, predefined thresholds for percentage changes between consecutively integrated intensities (i.e., consecutively integrated and normalized signals) for any given signal having a unique wavelength are about 3% to about 10%.

As illustrated by FIG. 6, the percentage change in the 822 nm signal between consecutive processing steps during and between the first 13 processing cycles 602A-602M are less than a predefined percentage change threshold. However, the percentage change in the 822 nm signal between the last processing step 604 of the processing cycle 602M and the first processing step 606 of the processing cycle 602N is greater than the predefined threshold (e.g., see jump in signal 608), thereby indicating that there is an unacceptable risk to the wafers for incurring a fabrication defect during further processing.

Referring again to FIG. 5, in step 535 a presence of wafer fabrication defects are predicted based on the analysis of the predictive data, also referred to as predictive signals (i.e. based on those integrated, normalized signal that are determined to be predictive by the AI model). In an embodiment, the optical emission spectrometer 402 determines a likelihood of the existence of wafer fabrication defects based on a percentage change of those integrated, normalized signals (e.g., integrated intensity of signals) that are determined to be predictive by the AI model over any consecutive processing steps (in the same processing cycle or between consecutive processing cycles). In one embodiment, the optical emission spectrometer 402 determines the presence of wafer fabrication defects when the percentage change of the integrated intensity over any consecutive processing steps for any one of those signals that are determined to be predictive by the AI model is greater than or equal to one or more predefined thresholds.

In another embodiment, the optical emission spectrometer 402 determines the presence of wafer fabrication defects when the integrated intensity or peak intensity over any processing steps for any one of those signals that are determined to be predictive by the AI model is greater than or equal to one or more other predefined thresholds.

In step 540, one or more control signals are generated by the optical emission spectrometer 402 based on the analysis of the received electromagnetic signals over the one or more processing steps, and a flow of one or more active gases into the plasma processing chamber 100 is controlled based on the one or more control signals, including halting the flow of the active gases and/or introducing cleaning gases for cleaning the chamber. In addition, or alternatively, an operator may halt the flow of active gases, halt the processing of wafers by the processing chamber, adjust the flow of active gases, or initiate a procedure for cleaning the chamber.

According to an illustrative embodiment of the present disclosure, when the predefined spectrum is defined to be 400-900 nm, and each received signal has a bandwidth of 5 nm, then in step 515 of FIG. 5 the optical emission spectrometer decodes n=101 signals across the predefined spectrum. Then, by way of exemplary illustration only, step 525 may determine that six received signals of the n=101 signals are predictive, for example, signals having peak wavelengths of 425 nm, 520 nm, 655 nm, 750 nm, 822 nm and 830 nm. According to one embodiment of the present disclosure, the predefined threshold for percentage changes between consecutively integrated intensities (i.e., consecutively integrated and normalized signals) for each of the six signals is 10%, and the action to be taken when the percentage change between consecutively integrated intensities (i.e., consecutively integrated and normalized signals) exceeds the 10% for each of the six signals is to halt the tool (e.g., halt the processing of wafers 110 in the processing chamber 100). However, in other embodiments of the present disclosure, the signals may have different predefined percentage change thresholds, and actions taken may include adjusting the flow of gases to the chamber 100, introducing cleaning gases into the chamber 100 for cleaning the chamber walls 118, or continuing the processing steps, but alerting quality control that the risk that the wafers 110 have processing-induced fabrication defects has increased.

Figure 7:
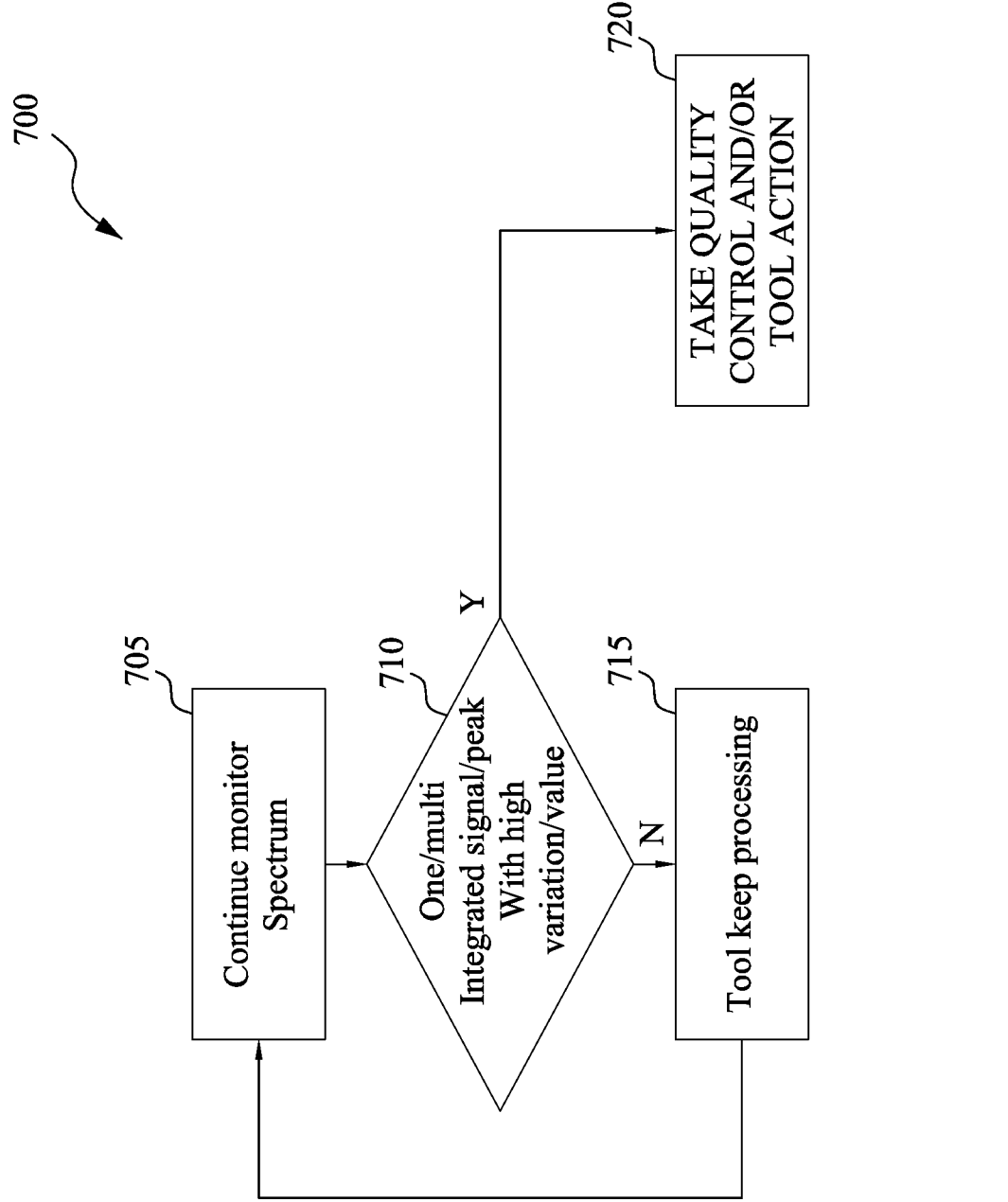
FIG. 7 is a flowchart of a method for monitoring the plasma processing of wafers in a plasma processing chamber, according to an embodiment of the present disclosure.

FIG. 7 is a flowchart of a method 700 for monitoring the plasma processing of wafers 110 in a plasma processing chamber 100, according to an embodiment of the present disclosure. In step 705, the predefined spectrum received by the optical emission spectrometer 402 is continuously monitored. In one embodiment, the predefined spectrum includes signals (i.e., data) having wavelengths between 300-900 nm, or alternatively, 300-800 nm. In an embodiment, continuous monitoring of the spectrum includes the steps 510-530 described above in conjunction with FIG. 5. In one embodiment, signals having wavelengths within the predefined spectrum are received from the processing chamber 100 during processing of the wafers 110 in the processing chamber 100, which may also be referred to as in-process processing, however, the scope of the present disclosure covers embodiments for which signals having wavelengths within the predefined spectrum are received from the processing chamber 100 during wafer-less processing or when the processing chamber 100 is in an idle state, as described further below.

Figure 8:
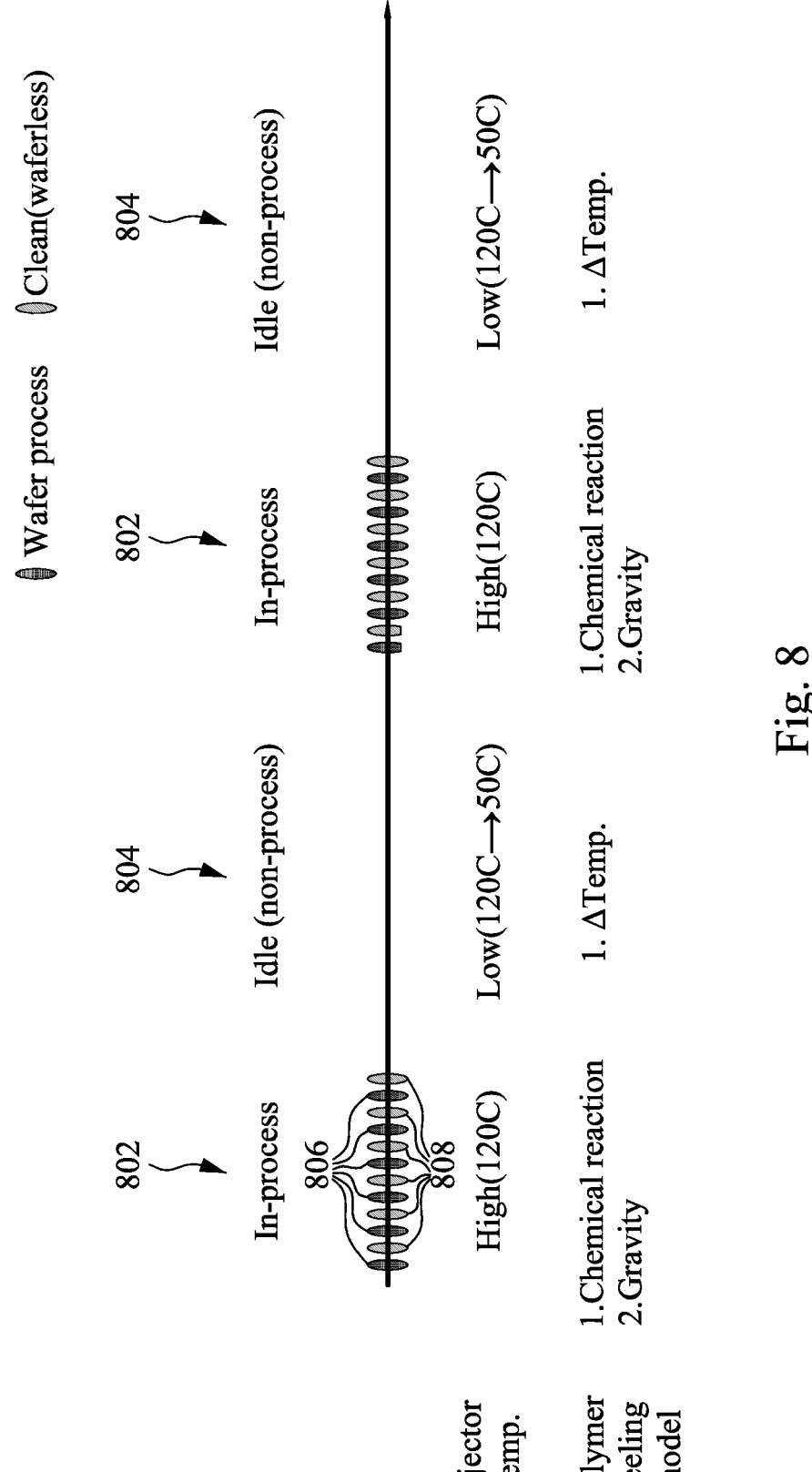
FIG. 8 illustrates in-process monitoring and idle process monitoring of the plasma processing chamber, according to an embodiment of the present disclosure.

For example, FIG. 8 illustrates in-process monitoring 802 and idle process monitoring 804 of the plasma processing chamber 100, according to an embodiment of the present disclosure. In one embodiment, in-process monitoring 802 includes monitoring 806 the plasma processing of wafers 110 in the plasma processing chamber 100, as described above in conjunction with FIG. 5, and monitoring 808 the cleaning process of the chamber 100. The cleaning process is performed on the chamber 100 when the chamber 100 does not include wafers 110 and monitoring the cleaning process is an example of wafer-less in-process monitoring. During in-process monitoring, temperatures of the injector 102 are about 120 C, however, temperatures may be above or below 120 C depending upon the type of processing steps performed. During in-process monitoring, polymer peeling from the walls 118 of the processing chamber 100 occur as a result of chemical reactions of the precursor polymers 116 with the reactive gases and/or plasma 112 as discussed above, and/or as a result of gravitation forces acting on the precursor polymers 116 attached to the walls 118 of the chamber 100.

In another embodiment, the plasma processing chamber 100 is monitored when the chamber 100 is in an idle state. The idle process monitoring 804 of the chamber 100 occurs when no processing steps are performed in the chamber 100 and when the chamber does not contain wafers 110. During idle process monitoring, temperatures of the injector 102 may decrease from about 120 C to about 50 C, and because of contraction of the walls 118 of the chamber 100 resulting from the change in chamber temperature, polymer peeling from the walls 118 of the processing chamber 100 may occur.

Referring again to FIG. 7, in step 710 the optical emission spectrometer 402 determines whether one or multiple integrated signals (e.g., integrated over a processing step time period) and/or one or more signal peak values (measured over a processing step time period) has a large variation between consecutive processing steps as compared to a predefined percentage variation threshold and/or a large value with respect to a predefined peak value threshold. If the optical emission spectrometer 402 spectrum determines that none of the integrated signals and/or none of the signal peak values are greater or equal to the predefined percentage variation threshold and/or the predefined peak value threshold, respectively, then in step 715 the tool (e.g., the plasma processing chamber 100) continues to perform processing steps on the wafers 110, and in step 705, the optical emission spectrometer 402 continues to monitor the predefined spectrum, received from the processing chamber 100.

If the optical emission spectrometer 402 determines that one or more of the integrated signals and/or one or more of the signal peak values are greater or equal to the predefined percentage variation threshold and/or the predefined peak value threshold, respectively, then in step 720, one or more actions are taken, including stopping the tool (e.g., the processing chamber 100) from performing processing steps, cleaning the processing chamber 100, adjusting the flow of gases to the processing chamber 100 for mitigating the peeling of polymer 116 from the walls 118 of the chamber 100 during future processing steps or initiating a quality control procedure (e.g., alerting quality control that the risk of processing-induced wafer defects has increased and appropriate wafer inspection procedures should be initiated).

The present disclosure provides a system and method for determining wafer fabrication defects resulting from plasma processing of wafers in a plasma processing chamber. The system and method include processing electromagnetic signals emitted from residual compounds peeled from the chamber walls during the plasma processing of the wafers to indirectly determine the likelihood that the wafers are incurring fabrication processing defects during the plasma processing.

In one embodiment, a system for monitoring a plasma process in a plasma processing chamber for fabrication defects on a semiconductor substrate resulting from the plasma processing of the semiconductor substrate in the plasma processing chamber includes an optical emission spectrometer configured to receive electromagnetic signals emitted by one or more residual compounds in the plasma processing chamber during plasma processing of the semiconductor substrate in the plasma processing chamber, and analyze the received electromagnetic signals over a time period for predicting the presence of wafer fabrication defects on the semiconductor substrate. The signals emitted by the residual compounds have unique wavelengths.

In another embodiment, a method for carrying out a plasma process on a semiconductor substrate in a plasma processing chamber includes performing plasma processing of the wafers, receiving, over a time period, electromagnetic signals emitted by one or more residual compounds in the plasma processing chamber during plasma processing of the semiconductor substrate in the plasma processing chamber, processing the received electromagnetic signals for generating predictive signals from the received electromagnetic signals, analyzing the predictive signals, predicting presence of fabrication defects based on the analysis of the predictive signals over the time period. The signals emitted by the residual compounds have unique wavelengths. The method includes modifying the plasma process based on the results of the predicting presence of fabrication defects on the semiconductor substrate.

In yet another embodiment, a method for cleaning a plasma processing chamber in which a plasma process is carried out on a semiconductor wafer includes performing plasma processing of the wafer. Over a period of time, electromagnetic signals emitted by one or more residual compounds in the plasma processing chamber during plasma processing of the semiconductor wafer in the plasma processing chamber are received. The received signals have corresponding wavelengths. The received signals are analyzed and presence of one or more residual compounds in the plasma processing chamber are predicted based on the analyzing of the received electromagnetic signals. The plasma process is stopped based on the results of the predicting presence of one or more residual compounds in the plasma processing chamber and the plasma processing chamber is cleaned to remove the residual compounds or precursors of the residual compounds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

For example, in one embodiment of the present disclosure, a computer-readable medium comprises instructions executable by a processor for determining wafer fabrication defects resulting from plasma processing of wafers in a plasma processing chamber by performing any of the procedures described in the present disclosure in conjunction with the system and methods for detecting wafer fabrication defects.

Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for carrying out a plasma process on a semiconductor substrate in a plasma processing chamber, comprising:

performing plasma processing of the semiconductor substrate, the plasma process including a plurality of processing steps;

receiving, over a time period, electromagnetic signals emitted by one or more residual compounds in the plasma processing chamber during plasma processing of the semiconductor substrate in the plasma processing chamber, the signals having corresponding wavelengths;

processing the received electromagnetic signals to generate predictive signals from the received electromagnetic signals, wherein processing the received electromagnetic signals includes integrating and normalizing the electromagnetic signals over the time period;

analyzing the predictive signals over the time period;

predicting presence of fabrication defects on the semiconductor substrate based on the analyzing of the predictive signals over the time period, wherein predicting includes comparing the predictive signals to predefined thresholds for percentage changes between consecutively integrated intensities of the predictive signals;

modifying a parameter of one processing step of the plurality of processing steps of the plasma process based on the results of the predicting presence of fabrication defects on the semiconductor substrate; and continuing to perform the processing step of the plasma process with the modified parameter.

2. The method of claim 1, further comprising:

generating one or more control signals based on the analyzing the predictive signals over the time period; and regulating a flow of one or more active gases into the plasma processing chamber based on the one or more control signals, wherein the parameter is a flowrate of the flow.

3. The method of claim 1, wherein the received electromagnetic signals have corresponding wavelengths chosen from at least one of 425 nm, 520 nm, 655 nm, 750 nm, 822 nm and 830 nm.

4. The method of claim 1, wherein the modified parameter includes one or more of gas flow rate, RF power, or processing time.

5. The method of claim 1, wherein the predefined thresholds for percentage changes between consecutively integrated intensities of the predictive signals is between 3% and 10%.

6. The method of claim 1, wherein the plasma processing of the semiconductor substrate in the plasma processing chamber is a dry etch, and the fabrication defects include incomplete etching of patterns in the semiconductor substrate caused by presence of the one or more residual compounds in trenches etched in the semiconductor substrate.

7. The method of claim 1, wherein the performing plasma processing utilizes active gases and the active gases are one or more of sulfur hexafluoride, carbon tetrafluoride, trifluoro methane, chlorine, boron trichloride, hydrogen bromide and octafluorocyclobutane.

8. A method for carrying out a plasma process on a semiconductor wafer in a plasma processing chamber, comprising:

performing plasma processing of the wafer;

receiving, over a time period, a plurality of electromagnetic signals emitted by one or more residual compounds in the plasma processing chamber during plasma processing of the semiconductor wafer in the plasma processing chamber, the plurality signals having corresponding wavelengths;

analyzing the plurality of received electromagnetic signals by integrating and normalizing the electromagnetic signals over the time period, including:

grouping the plurality of electromagnetic signals into groups based on their corresponding wavelengths; and generating a plurality of predictive data, wherein the predictive data includes one or more of peak intensities, duration, intensity patterns, or correlation to other wavelengths;

predicting presence of the one or more residual compounds in the plasma processing chamber based on the analyzing of the received electromagnetic signals by comparing the predictive data to predefined thresholds for percentage changes between consecutively integrated intensities of the predictive data;

stopping the plasma process based on the results of the predicting presence of the one or more residual compounds in the plasma processing chamber; and cleaning the plasma processing chamber after the stopping the plasma process has occurred to remove the one or more residual compounds from the plasma processing chamber.

9. The method of claim 8, further comprising initiating a quality control procedure that indicates that a risk of processing-induced defects for the semiconductor wafer has increased.

10. The method of claim 8, wherein the cleaning the plasma processing chamber removes precursors of the residual compounds from a surface of an injector port coupled to the plasma processing chamber or an exhaust port coupled to the plasma processing chamber.

11. The method of claim 8, wherein analyzing the plurality of received electromagnetic signals further comprises filtering the electromagnetic signals over the time period.

12. The method of claim 8, wherein the predefined thresholds for percentage changes between consecutively integrated intensities of the predictive data is 10%.

13. The method of claim 8, wherein the predefined thresholds for percentage changes between consecutively integrated intensities of the predictive data is 3%.

14. The method of claim 8, wherein the received electromagnetic signals have corresponding wavelengths chosen from at least one of 425 nm, 520 nm, 655 nm, 750 nm, 822 nm and 830 nm.

15. The method of claim 8, wherein the plasma processing includes dry etching, physical vapor deposition or chemical vapor deposition.

16. A method for carrying out a plasma process on a semiconductor wafer in a plasma processing chamber, comprising:

performing plasma processing of the wafer using a flow of one or more active gases, the flow having a rate of flow;

receiving at an optical emission spectrometer through a window in the plasma processing chamber, over a period of time, electromagnetic signals emitted by one or more residual compounds in the plasma processing chamber during plasma processing of the semiconductor wafer in the plasma processing chamber, the signals having corresponding wavelengths;

analyzing the received electromagnetic signals by integrating and normalizing the signals over the time period, and predicting presence of fabrication defects based on the analyzing, wherein predicting includes comparing the integrated and normalized signals to predefined thresholds for percentage changes between consecutively integrated intensities of the signals;

generating one or more control signals based on the analyzing of the received electromagnetic signals, wherein the control signals are configured to adjust the rate of flow of the one or more active gases;

maintaining the flow of the one or more active gases into the plasma processing chamber at an alternative rate based on the generated one or more control signals to mitigate a risk of the semiconductor wafer incurring fabrication defects; and adjusting the flow rate of the active gases in real-time based on continuous monitoring and analysis of the received electromagnetic signals.

17. The method of claim 16, further comprising inspecting the semiconductor wafer to check for any fabrication defects.

18. The method of claim 16, wherein the received electromagnetic signals have corresponding wavelengths chosen from at least one of 425 nm, 520 nm, 655 nm, 750 nm, 822 nm and 830 nm.

19. The method of claim 16, wherein the performing plasma processing utilizes active gases and the active gases are one or more of sulfur hexafluoride, carbon tetrafluoride, trifluoro methane, chlorine, boron trichloride, hydrogen bromide and octafluorocyclobutane.

20. The method of claim 16, wherein the plasma processing includes dry etching, physical vapor deposition or chemical vapor deposition.

* * * * *